United States Patent [19]

Ching et al.

[11] 4,206,447
[45] Jun. 3, 1980

[54] ADAPTIVE QUANTIZER APPARATUS FOR DIFFERENTIAL CODING OF NONUNIFORM DIGITAL SIGNALS

[75] Inventors: Yau-Chau Ching, Morganville; Ben-Zion Gotz, Holmdel, both of N.J.

[73] Assignee: Bell Telephone Laboratories Incorporated, Murray Hill, N.J.

[21] Appl. No.: 28,272

[22] Filed: Apr. 9, 1979

[51] Int. Cl.² ............................................. H04L 3/00
[52] U.S. Cl. ........................................... 340/347 DD
[58] Field of Search ............. 340/347 DD; 332/11 D; 325/38 B; 179/15 A P

[56] References Cited

U.S. PATENT DOCUMENTS

| 3,772,682 | 11/1973 | Flanagan | 340/347 DD |
|---|---|---|---|
| 3,931,596 | 1/1976 | Gersho | 325/38 B |
| 3,937,897 | 2/1976 | Song | 325/38 B |

OTHER PUBLICATIONS

Cummiskey, "The Bell System Technical Journal", vol. 52, Sep. 1973, pp. 1105-1118.
Jayant, "The Bell System Technical Journal", vol. 52, Sep. 1973, pp. 1119-1144.
Gibson, "IEEE Transactions on Communications", vol. COM-22, No. 11, Nov. 1974, pp. 1789-1797.
Mitra, "The Bell System Technical Journal", vol. 57, No. 7, part 2, Sep. 1978, pp. 2727-2763.

*Primary Examiner*—Charles D. Miller
*Attorney, Agent, or Firm*—Richard J. Roddy

[57] ABSTRACT

Known adaptive differential pulse code modulation (ADPCM) coders typically convert a nonuniform input signal to a linearized representation thereof prior to processing the signal. Usually the linearized signal requires more bits than the nonuniform signal. To mitigate the expense of apparatus for manipulating signals having many bits as well as to dissipate a scale size mistrack between the coder and a decoder, the instant ADPCM coder, responsive to an improved adaptive control signal, converts (300, 600) the nonuniform input signal to special semiuniform representation thereof which representation is processed (400, 500, 600) by the ADPCM coder. The semiuniform signal permits use of fewer bits than the prior art linearized representation. Also, the adaptive control signal is provided by a scale index generator including rounding-up and rounding-down means, for dissipating scale size mistrack. Further, the semiuniform signal permits much of the ADPCM process to be confined to relatively inexpensive read only memory (ROM) devices (300, 400, 500, 800).

6 Claims, 7 Drawing Figures

ADAPTIVE QUANTIZER APPARATUS FOR DIFFERENTIAL CODING OF NONUNIFORM DIGITAL SIGNALS

TECHNICAL FIELD

This invention relates to signal processing and, more particularly, to the code conversion of a digital signal from one code format to another code format.

BACKGROUND OF THE INVENTION

Adaptive differential pulse code modulation (ADPCM) coders, such as the one disclosed in U.S. Pat. No. 3,931,596, usually include a form of signal processing in which the difference between an input signal and a prediction of the input signal, the prediction usually being based upon past input signals, is quantized. The differential quantized signal is then coded as an output signal for transmission to a receiver where the original input signal is reconstructed. Such DPCM systems often lead to a reduction in bandwidth requirements because the quantized difference signal, sometimes called the error in prediction, usually requires fewer bits for transmission than does the quantized value of the original input signal.

Known DPCM and ADPCM coders, the latter including apparatus for adapting the quantization characteristic of the quantizer in response to some control signal such as the differential quantized signal, process a linear representation of the input signal. Hence, with a nonuniform encoded input signal, for example a signal encoded according to a $\mu=255$ segment companding law, a preprocessing conversion of the 8-bit input signal from its nonuniform format to a corresponding 14-bit linear format is common. Unfortunately, the linear format usually requires more bits than does the nonuniform format. As a result, additional expensive bit processing apparatus is common.

Accordingly, an object of the present invention is to provide a less expensive coder for processing nonuniformly encoded signals.

SUMMARY OF THE INVENTION

This and other problems are mitigated in accordance with the principles of our invention by improved coder apparatus for converting a nonuniform digital signal to an adaptively quantized output signal representation thereof. The converter includes a nonuniform-to-semiuniform signal converter which adapts to a quantizer characteristic in response to an adaptive control signal. A difference between the semiuniform signal and a prediction thereof is extended to an output terminal for transmission to a decoder and to a controller for providing the adaptive control signal. The prediction of the semiuniform signal is obtained responsive to a reconstruction of a prior semiuniform signal and to the adaptive control signal for adapting the predictor to a quantizer characteristic consistent with the nonuniform-to-semiuniform quantization characteristic.

BRIEF DESCRIPTION OF THE DRAWING

Our invention should become fully apparent when taken in connection with the following detailed description and the accompanying drawing in which.

DETAILED DESCRIPTION

Figure 1:
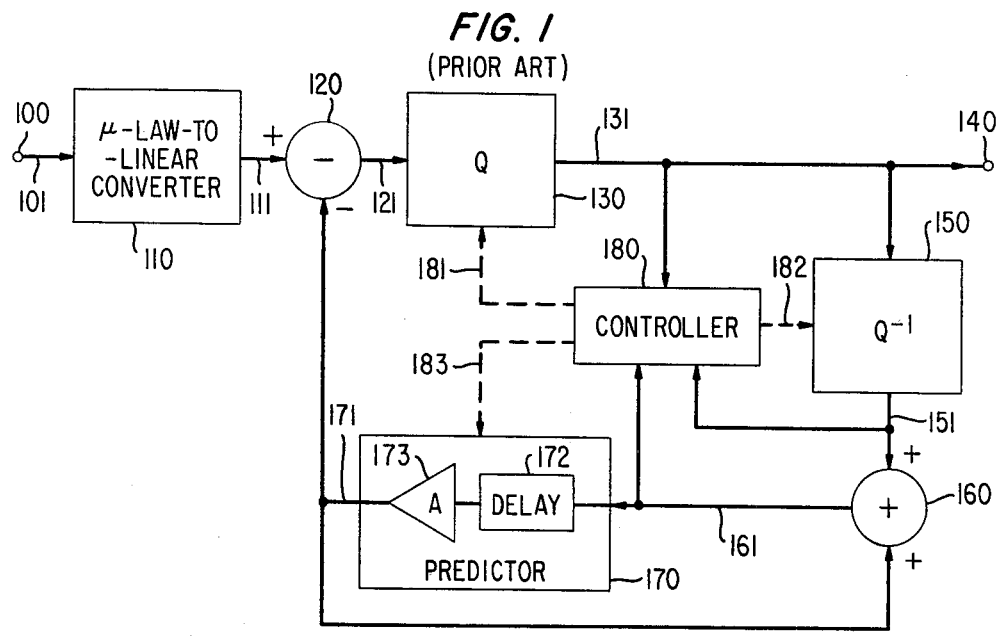
FIG. 1 depicts, in schematic form, a prior art adaptive differential pulse code modulation (ADPCM) coder.

FIG. 1 depicts, in schematic form, a prior art adaptive differential pulse code modulation (ADPCM) coder. A nonuniform encoded digital input signal, provided to input terminal 100, is extended over cable 101 to an input of nonuniform-to-linear converter 110. Without loss of generality and for brevity, converter 110 may be any standard converter apparatus for converting, for example, and 8-bit $\mu$-law encoded signal to its 14-bit linear counterpart. A fewer than a 14-bit linear counterpart may lead to an amplitude overload problem, i.e., there would be an insufficient number of bits available to define a large magnitude signal. A fewer than 14-bit linear counterpart may also lead to the introduction of excessive quantization noise. Clearly other nonuniform signals such as an A-law signal may be applied to terminal 100 and appropriately converted to a linear format. In any event, the linearized signal, extended over cable 111 to a first input of difference network 120, usually includes more bits than does the nonuniform input signal. A second input to difference network 120 is extended over cable 171 from an output of predictor 170, the second input being a prediction of the first input. The difference between the first and second inputs is extended as an error signal from an output of network 120 over cable 121 to an input of quantizer 130 for quantization according to an adapted quantization characteristic. The quantized difference signal is thereafter extended from an output of quantizer 130 jointly over cable 131 to output terminal 140 for transmission to a decoder, to a first input of controller 180, and to an input of inverse quantization apparatus 150. An output of inverse quantization apparatus 150, which is a reconstruction of the difference signal on cable 121, is supplied over cable 151 jointly to a second input of controller 180 and to a first input of adder 160, a second input of adder 160 being the prediction signal extended thereto over cable 171. The output sum of adder 160, which is a reconstruction of the linear signal on cable 111, is provided over cable 161 jointly to a third input of controller 180 and to an input of predictor 170. Predictor 170 for providing the prediction signal on cable 171 may, for example, include a simple delay network 172 coupled to an amplifier 173 for providing a gain A to the delayed sum on cable 161. Controller 180, responsive to its input signals, extends a first control signal over cable 181 to quantizer 130 responsive to which quantizer 130 adapts to the appropriate quantization characteristic. In similar vein, a second control signal is extended over cable 182 for adapting inverse quantizer 150. In some prior art ADPCM coders, predictor 170 may also be adaptive, for example, by adapting the prediction signal responsive to a third control signal supplied thereto over cable 183.

Figure 2:
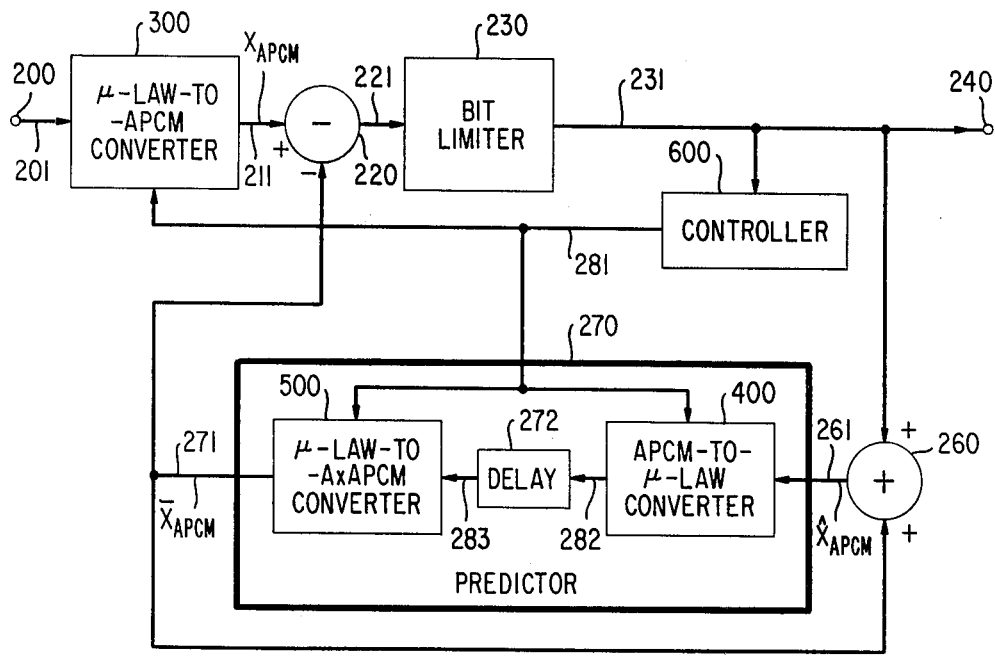
FIG. 2 depicts, in schematic form, an ADPCM coder in accord with the principles of our invention.

FIG. 2 depicts, in schematic form, an ADPCM coder in accord with the principles of our invention. Unlike the prior art wherein the 14-bit linear signal is processed by the ADPCM apparatus, our approach is to confine much of the ADPCM process within μ-law-to-APCM converter 300, APCM-to-μ-law converter 400, μ-law-to-AxAPCM converter 500, and controller 600. In so doing, the nonuniform input signal $X_\mu$ applied to terminal 200 may be converted to a special semiuniform signal representation thereof $X_{APCM}$ and the special semiuniform signal may then be processed by our improved ADPCM apparatus. Advantageously, the special semiuniform signal requires fewer bits than the linear signal. Also, the ADPCM process within converters 300, 400 and 500 and controller 600 is readily embodied in relatively inexpensive read-only memory (ROM) apparatus.

As a precursor to describing the details of converters 300, 400 and 500 as well as the details of controller 600, some observations are made. Firstly, μ-law-to-AxAPCM converter 500 may be functionally similar to μ-law-to-APCM converter 300, the difference being inclusion of an amplifier function in converter 500. Secondly, APCM-to-μ-law converter 400 may be functionally the inverse of μ-law-to-APCM converter 300. Thirdly, the quantization and inverse quantization are shifted outside the difference and adder networks and into the converters. And fourthly, responsive to the bit limited differential signal on cable 231, controller 600 provides a scale index control signal over cable 281 to respective control inputs of converters 300, 400 and 500. Responsive to the scale index control signal, the converters, and hence the ADPCM coder, adapt to the appropriate quantization characteristic.

Next, a brief description of a quantization characteristic. Quantization arrangements are typically characterized as "fixed" if the scale size (sometimes called the step size for uniform quantizers) is equal from sampling interval to sampling interval and are characterized as "adaptive" if the scale size is not necessarily equal for all sampling intervals. Denoting the scale size for the i-th sampling interval as $\Delta(i)$, then scale size may be adapted according to the rule $$\Delta(i+1)=\Delta(i)^\beta M(i, \Delta(i)); i=0, 1, 2 \ldots \quad (1)$$

where $\beta$ is a leakage constant typically having a range between zero and one and $M(i,\Delta(i))$ is a prespecified multiplier jointly dependent upon sampling interval i and scale size $\Delta(i)$. To avoid obfuscating our invention, we assume that the multipliers are idependent of scale size $\Delta(i)$ and hereinafter use the symbol M(i) to identify a prespecified multiplier for sampling invertal i. Hence, we assume a multiplier M(i) is selected from a collection of multipliers {M(1), M(2), M(3), ... }, which collection is prespecified according to a predefined strategy. One strategy is disclosed in N. S. Jayant, "Adaptive Quantization With a One-Word Memory," *The Bell System Technical Journal*, Vol. 52, No. 7 (September 1973), pp. 1119-1144, the teachings of which are incorporated herein by reference. It is widely recognized that Equation (1) is not in a form convenient for implementation. As a result quantization arrangements usually include a logarithmically transformed version of Equation (1), for example, $$d(i+1)=\beta d(i)+m(i) \quad (2)$$

where $$\Delta(i)=\Delta(0) \, Q^{d(i)} \text{ and } M(i)=Q^{m(i)}$$

for some convenient fixed $\Delta(0)$ and logarithmic base Q. For a μ-law input signal, it is common to let the minimum scale size, $\Delta(0)$, assume a value equal to 2 and the logarithmic base Q, which is also called the scale size resolution factor, assume a value between $2^{0.25}$ and 2.

Equation (2) assumes continuous values for scale index d(i) as well as infinite precision arithmetical operations. Hence, Equation (2) serves as an ideal. On the other hand, in a digital environment, a digital coder would usually have a limited dictionary, typically between 8 and 128 possible scale sizes. For purposes of illustration and not limitation, we assume scale index d(i) to be a K-bit (e.g., K=5) non-negative integer for representing $2^K$ permissible scale sizes, i.e., $0<d(i)<2^K-1$. Thus, $\Delta(i)$ has a minimum value equal to $\Delta(0)$ and has a maximum value equal to $\Delta(0) \, Q^{2^K-1}$. Unfortunately, large amplitude, slow varying input signals may generate small scale sizes and perhaps large magnitude signals for processing by the coder. As aforementioned, the large magnitude signals, in turn, may lead to an amplitude overload problem or an excessive quantization noise problem, which in the prior art were typically solved by converting an 8-bit μ-law signal to a 14-bit linear signal and processing the 14-bit linear signal.

According to one aspect of our invention, which we call semiuniform quantization, we combine uniform quantization for lower amplitude input signals and nonuniform quantization for larger amplitude signals. The resultant special semiuniform quantization signal $X_{APCM}$ includes fewer bits than the linear signal and yet is in a form for mitigating the prior art multibit solution to the overload and quantization noise problems.

More particularly, for each scale index d(i), there is a threshold value T(d(i)) such that, for an input signal at or below the threshold, uniform quantization is employed while, for an input signal above the threshold, nonuniform quantization, e.g., μ-law quantization, is employed. For convenience, each threshold T(d(i)) is assumed to have a value related to a μ-law segment boundary. As a result, all segments at or below the threshold have scale sizes which do not exceed $\Delta(i)$. On the other hand, all segments above the threshold have scale sizes which are greater than $\Delta(i)$. As a result, wasteful quantizer level assignment is mitigated. Also, stemming from our semiuniform quantization, the number of quantizing intervals does not, in our example, exceed 256 and therefore 8 bits is sufficient for the representation of the special semiuniform signal, which, as noted, is a fewer bit signal than is the linear prior art signal.

Still, more particularly, referencing FIG. 2, a nonuniform input signal is applied to input terminal 200. Again for descriptive purposes only, we assue a μ-law input signal. The input signal $X_\mu$ is extended over cable 201 to an input of μ-law-to-APCM converter 300. The special signal output $X_{APCM}$ from converter 300 is extended over cable 211 to an input of difference network 220. The special signal is according to our semiuniform quantization. In our illustrative example, the special signal represents the number of quantizing steps according to the quantization characteristic to which converter 300 adapts responsive to the scale index control signal on cable 281. A second input to difference network 220 is extended over cable 271 from an output of predictor 270, the second input being a prediction of the special semiuniform signal on cable 211. The difference between the first and second inputs, i.e., the difference between the semiuniform signal and the prediction signal, is extended over cable 221 from an output of network 220 as a (K+L)-bit signal and thence through standard bit limiter 230 for constraining the magnitude of the difference signal to a value between zero and $2^{k-1}-1$ by removing L-bits (where L<0) from the difference signal. The bit limited signal is then extended as a K-bit signal (the K-bits including a sign bit) over cable 231 jointly to output terminal 240 for transmission to a decoder, to an input of controller 600, and to a first input of adder 260. It should be noted that the bit limiting relates to the difference in the number of quantizing steps between the semiuniform signal and its prediction and does not relate to the amplitude of the difference signal. Hence our coder avoids the aforementioned amplitude overload and quantization noise problems.

Fortuitously, in accord with another aspect of our invention, the special semiuniform signal and the prediction thereof, both being responsive to the same scale index control signal d(i), may be linearly subtracted to obtain the difference signal even though both may be nonuniform. A second input to adder 260 is the prediction signal extended thereto over cable 271. An output sum of adder 260, which is a reconstruction of the special signal on cable 211, is extended over cable 261 to an input of predictor 270 and therein to an input of APCM-to-$\mu$-law converter 400. In accord with another aspect of our invention, the (K+L)-bit prediction signal on cable 271 and the K-bit output difference signal on cable 231, both being responsive to the same scale index control signal d(i) and when bit aligned, may be linearly added to obtain the adder output sum. An output of converter 400 is supplied through delay network 272 to an input of $\mu$-law-to-AxAPCM converter 500 thence to cable 271 as the prediction signal for the next, or (i+1)-st, sampling interval.

Figure 3:
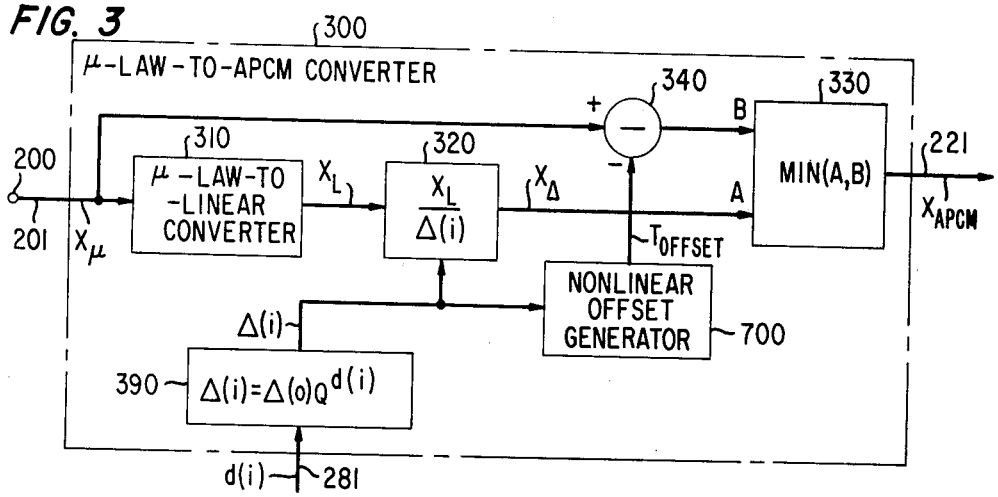
FIG. 3 depicts, in schematic form, an illustrative nonuniform-to-APCM converter for use in the coder of FIG. 2.
Figure 4:
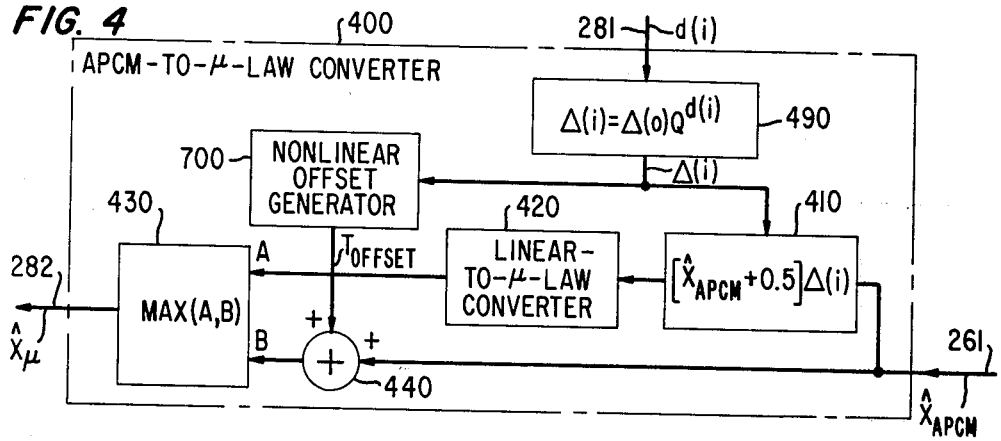
FIG. 4 depicts, in schematic form, an illustrative APCM-to-nonuniform converter for use in the coder of FIG. 2.
Figure 5:
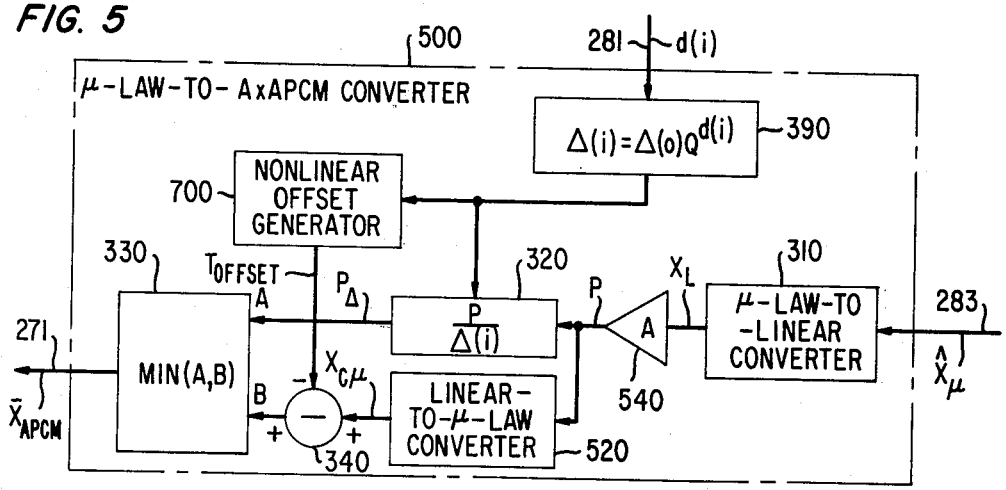
FIG. 5 depicts, in schematic form, a nonuniform-to-AxAPCM converter for use in the coder of FIG. 2.
Figure 6:
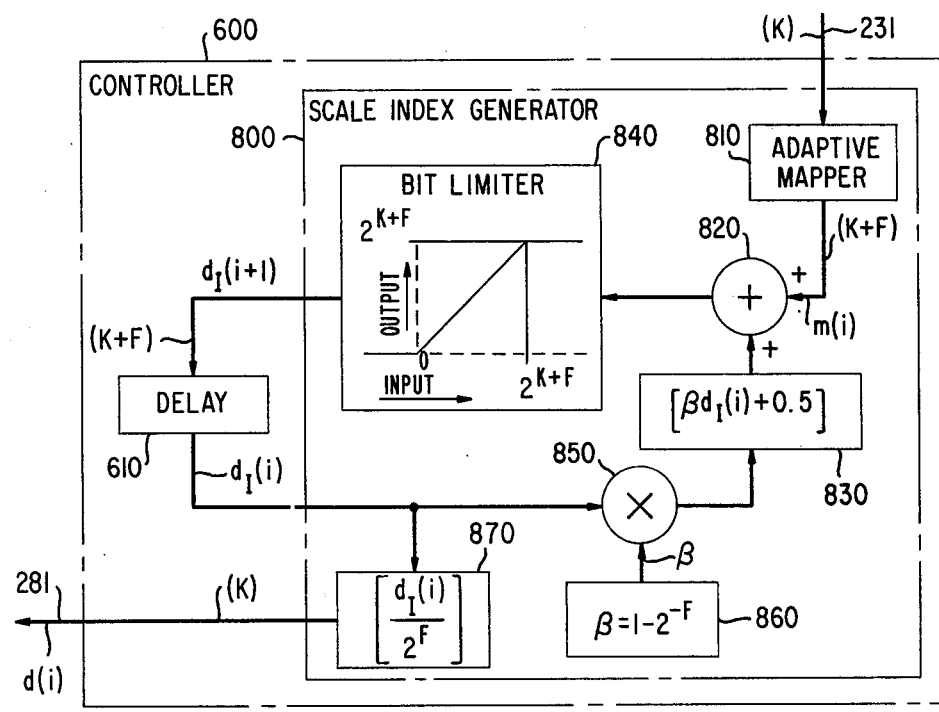
FIG. 6 depicts, in schematic form, an illustrative controller for use in the coder of FIG. 2.

Converters 300, 400 and 500 are schematically shown in FIGS. 3, 4 and 5, respectively, and controller 600 is shown in FIG. 6. Each of converters 300, 400 and 500 is, responsive to a scale index control signal d(i) extended over cable 281 from an output of controller 600, for converting its respective input signal from one format to a second format.

Turning to FIG. 3, the nonuniform input signal is extended from terminal 200 over cable 201 to $\mu$-law-to-APCM converter 300 and therein the sign bit (not shown) may be extended directly to cable 211 while the segment and mantissa bits of the assumed $\mu$-law signal, labelled $X_\mu$, are provided jointly to an input of $\mu$-law-to-linear converter 310 and to a minuend input of difference network 340. Converter 310 may be a functional equivalent of the prior art type shown as converter 110 in FIG. 1. The linear signal $X_L$ output of converter 310 is extended to a dividend input of division circuit 320. The quotient output $X_\Delta$ of circuit 320, which output is the linear signal $X_L$ normalized with respect to the scale size signal $\Delta(i)$, is provided to an A input of minimum detecting circuit 330. Regarding scale size, scale index control signal d(i), responsive to which converter 300 adapts to the appropriate quantization characteristic, is converted by circuit 390 in accord with aforementioned Equation (2) for providing scale size signal $\Delta(i)$ jointly to a divisor input of circuit 320 and to an input of nonlinear offset generator 700. Generator 700, hereinafter described, provides an offset signal, $T_{OFFSET}$, to a subtrahend input of difference network 340. The minimum as between the output of difference circuit 340, which is supplied to the B input of circuit 330, and the normalized output of division circuit 320 $X_\Delta$ is extended as an output of minimum detecting circuit 330, said output being our special semiuniform signal $X_{APCM}$.

Turning to FIG. 4, APCM-to-$\mu$-law converter 400 is functionally the inverse of converter 300. That is, responsive to the reconstruction $\hat{X}_{APCM}$ of the special semiuniform signal $X_{APCM}$ as supplied over cable 261 from the output of adder 260 and to the scale index control signal d(i) as supplied over cable 281 from the output of controller 600, a reconstruction $\hat{X}_\mu$ of the $\mu$-law input signal $X_\mu$ as supplied to terminal 200 is supplied from an output of converter 400 over cable 282. Specifically, the sign bit (not shown) of the special signal may be extended directly to output cable 282. The remaining bits of the reconstructed special signal $\hat{X}_{APCM}$ are supplied jointly to an input of adder 440 and to an input of rounding-up multiplier 410 wherein a factor of one-half is added to the reconstructed special signal for rounding same upward and the integer portion of the resultant sum is multiplied by scale size $\Delta(i)$. The linear product output of multiplier 410 is then converted to a $\mu$-law signal by converter 420 and thence extended to an A input of maximum detecting circuit 430. Scale index control signal d(i), responsive to which converter 400 adapts to the appropriate quantization characteristic and supplied on cable 281, is converted by circuit 490 in accord with Equation (2) for providing scale size signal $\Delta(i)$ jointly to a second input of multiplier 410 and to an input of offset generator 700 for providing the offset signal $T_{OFFSET}$. The offset signal is supplied to a second input of adder 440. An output of adder 440 is supplied to the B input of maximum detecting circuit 430. The maximum as between the A and B inputs is extended from the output of circuit 430 over cable 282 as a $\mu$-law reconstruction $\hat{X}_\mu$ of the $\mu$-law input signal $X_\mu$.

Turning to FIG. 5, but for the aforementioned linear gain of A provided by amplifier 540 and the linear-to-$\mu$-law conversion of converter 520, $\mu$-law-to-AxAPCM converter 500 is functionally and structurally identical to $\mu$-law-to-APCM converter 300, and hence its components are correspondingly labelled. Noteworthy, responsive to the scale index control signal d(i) on cable 281, converter 500 also adapts to the appropriate quantization characteristic. In particular, amplifier 540 provides a gain A to the linear signal $X_L$ output of converter 310, which amplified signal P is supplied jointly to a dividend input of division circuit 320 and to an input of converter 520 for converting the amplified signal P to a $\mu$-law signal $X_{c\mu}$. A difference between the converted $\mu$-law signal $X_{c\mu}$ and the offset signal $T_{OFFSET}$ extended from generator 700 is provided from an output of difference network 340 to a B input of minimum detecting circuit 330. The amplified signal P is normalized by division circuit 320 with respect to the scale size $\Delta(i)$, the normalized signal $P_\Delta$ being extended to the A input of minimum detecting circuit 320. The minimum as between the A and B inputs is extended onto cable 271 as the prediction signal $\overline{X}_{APCM}$.

Figure 7:
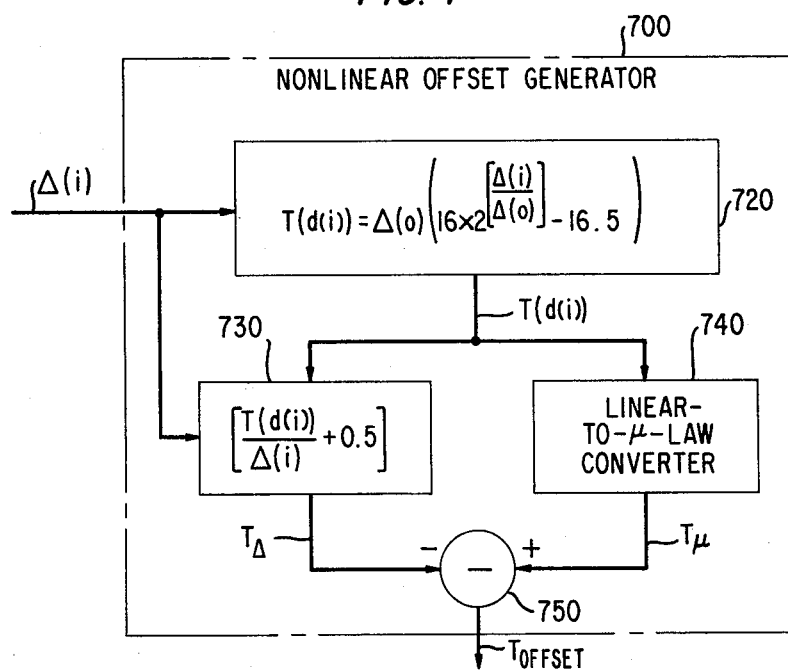
FIG. 7 depicts, in schematic form, an illustrative nonlinear offset generator for use in the converters of FIGS. 3, 4 and 5.

Turning to FIG. 7, nonlinear offset generator 700, responsive to a scale size signal $\Delta(i)$, provides the offset signal $T_{OFFSET}$. Specifically, the aforedescribed threshold signal T(d(i)) is supplied by circuitry 720. Uniform quantization is employed for all segments at or below the threshold. On the other hand, nonuniform quantization, here μ-law quantization, is used for all segments above the threshold. In our example, the threshold is related to the boundary between segments, the relation being $$T(d(i)) = \Delta(0)\{16 \times 2[\Delta(i)/\Delta(0)] - 16.5\} \quad (3)$$

where the symbol [Δ(i)/Δ(0)] means the largest integer in the quotient after the resultant division. The threshold signal is provided jointly to an input of linear-to-μ-law converter 740, an output of which is supplied to a minuend input of difference circuit 750, and to a dividend input of circuit 730, an output of which is supplied to a subtrahend input of difference circuit 750. An output of difference circuit 750 is the offset signal $T_{OFFSET}$. Circuit 730 normalizes the threshold with respect to scale size signal Δ(i), which is supplied to the divisor input of circuit 730, and extends a normalized output $T_\Delta$ equal to the largest integer in the threshold signal normalized with respect to the scale size signal Δ(i) after being rounded upward by a factor of one-half. The resultant offset signal may be used by converters 300, 400 and 500 as hereinbefore described.

Turning to FIG. 6 controller 600, responsive to the K-bit signal on cable 231, supplies the K-bit scale index control signal d(i) on cable 281. Unfortunately, a problem may arise in part because of the finite precision typically associated with digital apparatus and in part because of channel error. In particular, to mitigate a synchronization problem, here for example, to dissipate a mistrack between scale size usd at the coder and scale size used at the decoder, our scale adaption process within controller 600 employs signals of (K+F)-bits. The F-bits are called fractional bits in the art and may be the least significant bits of the signals within controller 600. Also to aid in dissipating the mistrack between coder and decoder, we assume $$\beta = 1 - 2^{-F} \quad (4)$$

The speed in dissipating mistrack increases as β becomes small. Unfortunately, small β may adversely effect coder/decoder performance, for example, by degrading the signal-to-noise ratio in its dynamic range. That is, without channel error, the signal-to-noise ratio increases as β approaches unity. On the other hand, as β approaches unity, the number of fractional bits increases leading to a larger bit signal within controller 600. Toward solving the performance problem and yet dissipating the mistrack, our coder employs "rounding up" and "rounding down" arithmetic. For example, assuming F=3, i.e., three fractional bits, it becomes clear from Equation (4) that β=0.875. Rounding up is provided by apparatus 830 of FIG. 6 while rounding down is provided by apparatus 870. Also the symbol $d_f(i)$ represents the "internal" representation of the scale index control signal d(i), that is internal with respect to controller 600. The internal control signal $d_f(i)$ is represented by (K+F)-bits, while the scale index control signal d(i) is represented by K-bits.

Specifically, the K-bit, bit limited difference signal on cable 231 is supplied to adaptive mapper 810 for mapping the difference signal to a logarithmic multiplier m(i) having (K+F) bits. The mapping may be as disclosed in Jayant. Still another mapping may be responsive to both the internal control signal $d_f(i)$ and to the difference signal on cable 231. Consistent with Equation (2), the logarithmic multiplier m(i) is supplied to one input of adder 820. Also, the internal scale index $d_f(i)$ is supplied to one input of multiplier 850, the second input being a fixed β supplied from apparatus 860, here β=0.875. The product output of multiplier 850 is supplied to an input of rounding up apparatus 830. A second input of adder 820 is extended from an output of rounding up apparatus 830 for rounding up the internal representation of $\beta d_f(i)$. Since adder 820 may overflow, bit limiter 840 constrains the next logarithmic scale size $d_f(i+1)$ to a non-negative number between zero and $2^{K+F}$, which is delayed one sampling interval by network 610. The internal logarithmic scale index $d_f(i)$ output of network 610 is rounded down after removal of the F fractional bits by apparatus 870 for providing the scale index control scale d(i) onto cable 281. As aforedescribed, responsive to the scale index control signal d(i), each of converters 300, 400 and 500 adapts to the appropriate quantization characteristic.

It may appear from the foregoing description that converters 300, 400 and 500 as well as controller 600 may employ more expensive apparatus or require apparatus for processing more bits than the aforestated prior art. However, the process embodied in the aforedescribed apparatus may be programmed on a standard digital computer for providing tables, which tables may be stored in standard read only memories (ROMs). Each ROM, responsive to its respective input and control signals, extends at an output thereof the table entry situated in the memory location uniquely identified by its input and control signals. For example, converter 300, assuming an 8-bit nonuniform input signal and a (K=) 5-bit adaptive control signal, can be embodied in a ROM having $2^{13}$ memory locations, each location for storing an 8-bit semiuniform quantization signal code. In so doing, the ADPCM process embodied in each of converters 300, 400 and 500 as well as in scale index generator 800 of controller 600 subsumes to a relatively inexpensive table look-up arrangement wherein the multibit expensive prior art processing is mitigated.

Although our invention has been described and illustrated in detail, it is to be understood that the same is by way of illustration only. Various modifications will occur to those skilled in the art. For example, there exist different rules for adapting scale size. Thus, the spirit and scope of the invention are limited only by the appended claims.

We claim:

1. Signal coder apparatus for converting a nonuniform digital input signal supplied to an input terminal (200) to an adaptively quantized output signal representation thereof and for extending said output signal to an output terminal (240) for transmission to a decoder, said coder apparatus including a controller (600) responsive to said Output signal for providing an adaptive control signal and a predictor (270) responsive to said output signal for providing a prediction signal and CHARACTERIZED IN THAT said coder apparatus further comprises first converter means (300) responsive to said adaptive control signal for adapting to a quantizer characteristic and for converting said input signal to a semiuniform quantization signal through said quantizer characteristic, said semiuniform signal combining uniform quantization for input signals having an amplitude not exceeding an adaptive threshold and nonuniform quantization for input signals exceeding said threshold, and means (220, 221, 230, 231) for extending a difference between said semiuniform signal and said prediction signal to said output terminal as said output signal.

2. The coder apparatus defined in claim 1 wherein said predictor (270) includes second converter means (400) responsive to said adaptive control signal for adapting to said quantizer characteristic and for converting a reconstruction of said semiuniform signal to a reconstruction of said nonuniform input signal and third converter means (500) responsive to said adaptive control signal for adapting to said quantization characteristic and for converting said reconstruction of said nonuniform signal to said prediction signal.

3. The coder apparatus defined in claim 1 wherein said controller (600) includes round-up means (830) and round-down means (87) for dissipating scale size mistrack between coder and decoder.

4. Signal coder apparatus for converting a nonuniform digital signal supplied to an input terminal (200) to an ADPCM signal and for extending said ADPCM signal to an output terminal (240) for transmission to a decoder, said coder apparatus including a controller (600) for providing an adaptive control signal for adjusting a quantization characteristic and a predictor (270) for providing a prediction of a first signal and CHARACTERIZED IN THAT said coder apparatus further includes first converter apparatus (300) responsive to said adaptive control signal for converting said nonuniform digital signal to a semiuniform signal and means (220, 221, 230, 231) for extending a difference between said semiuniform signal and said prediction to said output terminal as said ADPCM signal, said first signal being said semiuniform signal.

5. The coder apparatus defined in claim 4 wherein said predictor includes second converter (400) responsive to said adaptive control signal for converting a reconstruction of said semiuniform signal to a reconstruction of said nonuniform signal and means (282, 272, 283, 500, 271) responsive to said adaptive control signal and to said reconstructed nonuniform signal for extending said prediction of said semiuniform signal.

6. The coder apparatus defined in claim 4 wherein said controller includes rounding-up means (830) and rounding-down means (870) for mitigating scale size mistrack between coder and decoder.

* * * * *